United States Patent
Mosch (10) Patent No.: US 7,107,387 B2
(45) Date of Patent: Sep. 12, 2006

(54) CONTROL MODULE COMPRISING A ROM WITH REDUCED ELECTRICAL CONSUMPTION

(75) Inventor: Philippe Mosch, Lausanne (CH)

(73) Assignee: Semtech Neuchatel SA, Neuchatel (CH)

( * ) Notice: Subject to any disclaimer, the term of this patent is extended or adjusted under 35 U.S.C. 154(b) by 244 days.

(21) Appl. No.: 10/366,725

(22) Filed: Feb. 14, 2003

(65) Prior Publication Data

US 2003/0156480 A1    Aug. 21, 2003

Related U.S. Application Data

(63) Continuation of application No. PCT/CH00/00442, filed on Aug. 17, 2000.

(51) Int. Cl.
*G06F 12/00* (2006.01)

(52) U.S. Cl. .................... 711/102; 711/156
(58) Field of Classification Search ............ 711/101, 711/102, 103, 156; 713/320; 365/189.05
See application file for complete search history.

(56) References Cited

U.S. PATENT DOCUMENTS

| | | | | |
|---|---|---|---|---|
| 5,479,632 A * | 12/1995 | Sato et al. | ................... | 711/214 |
| 5,799,144 A * | 8/1998 | Mio | ............................ | 714/38 |
| 5,940,332 A | 8/1999 | Artieri | | |
| 5,996,041 A | 11/1999 | Kim | | |
| 6,279,069 B1 * | 8/2001 | Robinson et al. | ........... | 711/103 |
| 6,336,166 B1 * | 1/2002 | Kelly | ......................... | 711/118 |
| 6,363,001 B1 * | 3/2002 | Borot et al. | ................ | 365/104 |

FOREIGN PATENT DOCUMENTS

| | | |
|---|---|---|
| EP | 0 917 154 A3 | 6/1998 |
| EP | 0 917 154 A2 | 5/1999 |

* cited by examiner

*Primary Examiner*—Gary Portka
(74) *Attorney, Agent, or Firm*—Blank Rome LLP (57) ABSTRACT

A control module (1) having the following elements: a read-only memory (ROM 2), a temporary buffer (6), into which the data of said ROM (2) can be transferred in order to be accessible from outside the control module, a read controller (3), for selecting at each cycle the portions of said ROM transferred into said temporary buffer, wherein the portions selected by said read controller (3) depend on the contents of said ROM. One advantage of the invention is the reduction of the electric consumption, since the ROM does not have to be read when the data are already available in the temporary buffer.

15 Claims, 5 Drawing Sheets

PRIOR ART

| | | |
|---|---|---|
| 001 | 0001 | 0001 |
| 101 | 0101 | 0101 |
| 011 | 0011 | 0011 |
| 100 | 1100 | 1100 |
| 100 | 1100 | 1111 |
| 100 | 1100 | 1111 |
| 100 | 0100 | 0111 |
| 010 | 1010 | 1010 |
| 010 | 1010 | 1111 |
| 010 | 1010 | 1111 |
| 010 | 0010 | 0111 |
| 111 | 0111 | 0111 |
| 101 | ?101 | ?101 |

Fig.5

CONTROL MODULE COMPRISING A ROM WITH REDUCED ELECTRICAL CONSUMPTION

This application is a continuation of PCT application NO PCT/CH00/00442 (WO0215192) filed Aug. 17, 2000, the content of which is hereby incorporated.

FIELD OF THE INVENTION

The present invention concerns a control module comprising a ROM (Read Only Memory), in particular an instructions memory, with reduced electrical consumption. The present invention can apply in particular to control modules used notably in microprocessors, notably in "massively" parallel microprocessors such as signal processors (DSP, Digital Signal Processor).

RELATED ART

Microprocessors comprising a control module (control bloc) and a data path through which the data processed by the processor are traveling are already known. The control module frequently comprises a ROM in which command instructions are stored for the different modules of the data path, for example for one or several arithmetic and logic units, etc. In the case of a signal processor, the instructions stored in the memory are frequently read sequentially or according to a predetermined sequence in order to execute series of operations on the signal, for example operations of digital filtering, transformation functions of the type FFT (Fast Fourier Transform), etc.

Figure 1:
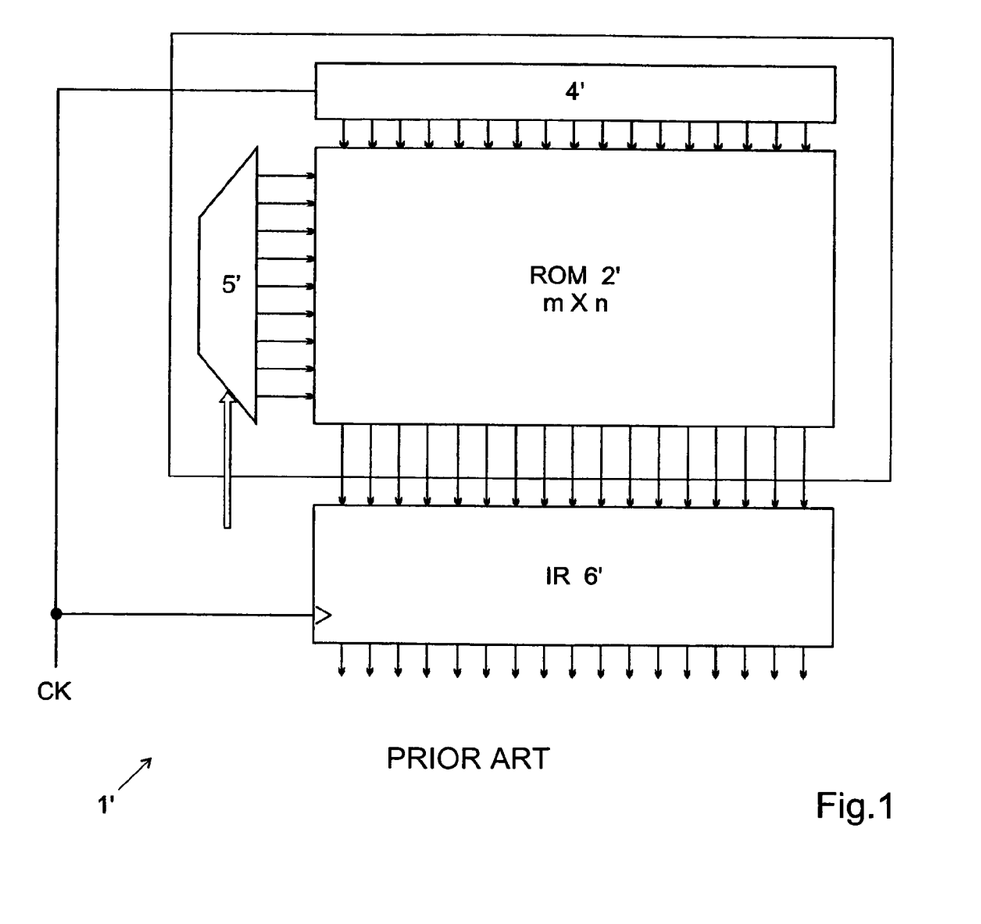
FIG. 1, already described, illustrates diagrammatically the structure of a prior art control module.
Figure 2:
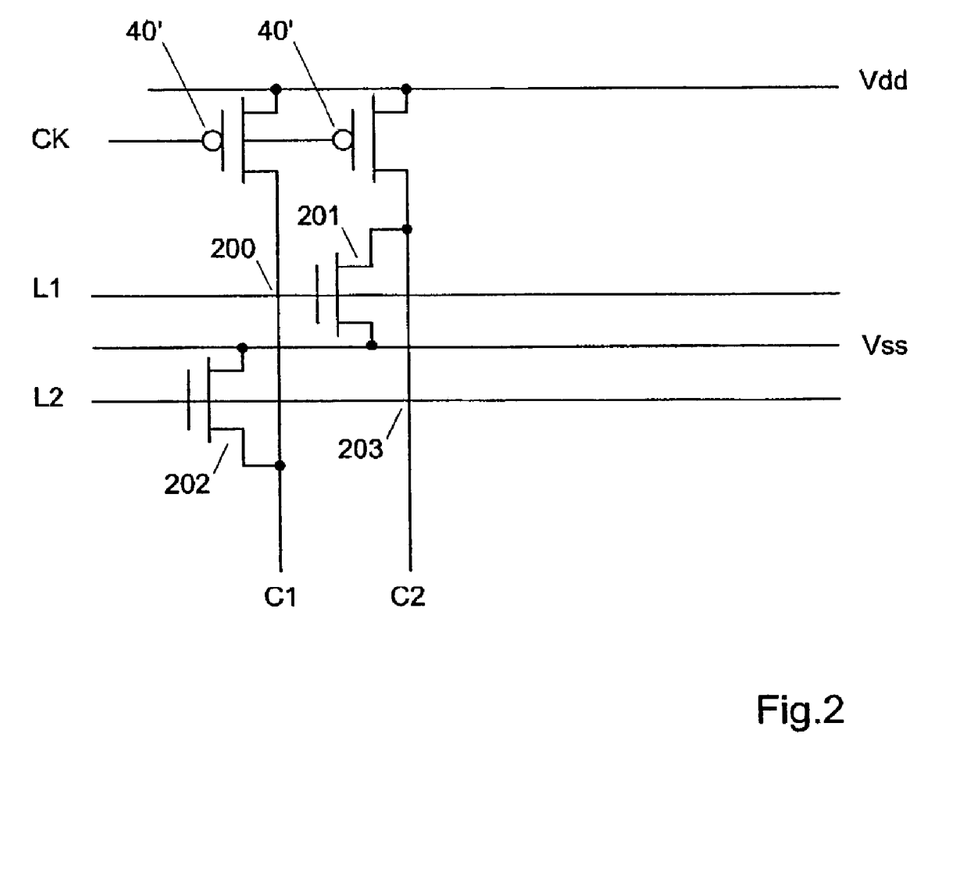
FIG. 2, already described, illustrates the structure of four cells extracted from a ROM of the type NOR, and capable of being used in the module according to the invention.

FIG. 1 illustrates diagrammatically a control module 1' used in known signal processors. The module 1' comprises a ROM 2' of m lines and n columns in which instructions are stored. A demultiplexer 5' allows to select the line that is to be read. Each of the m×n cells of the ROM is capable of storing a bit indicating a logic state zero (0) or one (1). FIG. 2 illustrates four neighboring cells among the m×n cells of a ROM 2' of the type NOR. The cells 201 and 202 in this example comprise a transistor for encoding a logical "zero"; "ones" are programmed in the cells 200 and 203 by the absence of transistors.

The drains of all the transistors of a same column are connected to a same connection C1, C2, etc. The source of all the transistors is connected to a common voltage Vss, for example to the mass. The gate of the transistors of a same line is connected to a common connection L1, L2, etc.

The ROM 2' further uses a column preload circuit 4', constituted in this example by an additional line of preload transistors 40' whose gate is connected to a preload line CK, the source to a feed voltage Vdd and the drain to each of the columns C1, C2, etc.

Certain ROMs additionally use a distribution of the columns in groups of adjacent columns, a multiplexer enabling the selection, at any moment, among any group, of the column that is to be activated. The number of columns of the memory is in this case greater than the number of output bits supplied at each reading cycle.

The ROM 2' is read by applying a low voltage (for example Vss) to the preload line CK, which causes each of the preload transistors 40' to become conducting so as to "preload" each column with a voltage Vdd indicating a logic state "one". In a second evaluation phase, a high tension (for example Vdd) is applied on the line selected by the demultiplexer 5', for example on the line L1, thus causing each transistor on this line to become conducting, in this example the transistor 201. The column (C2) to which this transistor (201) is connected is thus "pulled" through this transistor to the drain's voltage Vss, indicating a logical "zero". The voltage of the columns (C1) that are not connected by a transistor to the selected line (L1) remains Vdd, indicating a logic "one". The instruction stored in the read line (L1) is thus available on the ROM's columns C1, C2, . . . and can be loaded in the instructions register 6' (illustrated in FIG. 1) for controlling the signal processing modules in the processor's data path. The ROM's reading is continued during the following cycle by selecting another line under the control of the aforementioned address controller.

The ROM 2' thus drains electricity at each reading cycle for preloading all the columns. In the case of an instructions memory used in a "massively" parallel signal processor, i.e. comprising a great number of signal processing modules in parallel in the data path, the number of columns in the instructions memory 2' and more generally the size of this memory become considerable, causing a substantial electric consumption.

In the prior art systems, all the columns are preloaded at each cycle, independently of the use made of the instruction read. The electric consumption at each cycle thus remains considerable even when only part of the instruction read in the memory is really used for controlling the corresponding modules of the data path during that cycle. When the program stored in the memory does not use optimally the processor's parallel processing capabilities and many modules of the data path remain unused at each instruction cycle, the electric consumption of the ROM 2' becomes critical, particularly if the processor is designed to be used in an electrically autonomous device, for example in a hearing aid, a portable telephone, a GPS receiver, a modem, etc.

Other types of dynamic or static ROMs are known that all show however the inconvenience of draining electric current for reading each column.

An aim of the present invention is thus to propose a control module that is improved over the prior art memories, in particular an instructions memory with a reduced electric consumption.

In particular, an aim of the present invention is to propose a control module with reduced electric consumption and capable of being used in a massively parallel processor, notably in a signal processor.

Patent application EP0917154 describes an instructions memory in which the electric consumption is reduced by optimizing the encoding of the programmed instructions so as to limit the number of logic "zeros" and thus the number of transistors in the memory. Most of the columns are thus not unloaded at each evaluation cycle, which avoids them having to be re-loaded during the following preload cycle.

However, in an "ideal" circuit, the width of the ROM (i.e. the number of output bits) corresponds to the number of instructions to be encoded, including the operands for these instructions. For example, a ROM of 16 bits width can be used for encoding $2^{16}$ different instructions. The degree of freedom available for encoding the different instructions in an optimized processor architecture is thus limited, so that the reduction of the consumption afforded by the solution described in EP0917154 is limited.

Furthermore, the code stored in the ROM must be completely transcribed in order to reduce the number of logic zeros, so that special compilers must be used for generating this code. These compilers are not always available for every application. Moreover, these memories cannot be used instead of an existing instructions memory in a processor without having to transcribe completely the code of the applications written for this processor.

An aim of the present invention is thus also to propose a control module with reduced electric consumption that can be programmed by means of instructions modified only marginally over the programming instructions of a conventional control module.

There are other circuits that enable the electric consumption to be reduced by modifying the preload circuit 4. Despite the improvements afforded by these circuits, a need remains for solutions allowing the consumption to be reduced further.

BRIEF SUMMARY OF THE INVENTION

According to the invention, the aforementioned aims are achieved by means of a control module comprising the features of the independent claim. Preferred embodiments are furthermore indicated in the dependent claims.

In particular, these aims are achieved by means of a module comprising a ROM, a temporary buffer into which the data of said ROM can be transferred in order to be accessible from outside the control module, a read controller for selecting at each cycle the portions of said ROM transferred into said temporary buffer, and in which the portions selected by the read controller depend on the contents of the ROM.

This solution makes it possible to forgo reading the ROM when the read data are already available in the instructions register at the output of the ROM. The electric consumption is thus reduced by avoiding preloading the columns containing, on the selected line, the data already available outside the ROM.

The read controller allows to select, at each reading cycle, whether the memory's line selected by the address controller must be read, or which portions of this line must be read. The address controller's operation is determined by the data read previously in the ROM, for example by one or several bits added to the preceding instruction.

It is already known how to use cache memories through which data exiting from a slow access main memory are made to travel. An address controller checks at each reading access of the memory whether the indicated address has already been accessed recently. If this is the case, the sought data are extracted from the cache memory instead of being read in the slower main memory, which makes it possible to reduce the access time. Cache memories however do not generally allow the electric consumption to be reduced; on the contrary, the electric consumption of the fast cache memory is often quite considerable. Furthermore, these circuits require a complex address controller that can check whether the sought data are available in the cache memory; this controller's consumption is added to that of the memories. Moreover, these cache memories are not directly connected to the output of the ROM, which thus also requires a temporary buffer into which the read data must be transferred at each cycle.

The invention however requires no temporary or cache memory other than the register used directly to the ROM's output for storing the data read at each cycle. Furthermore, it also permits to avoid reading lines or sections of lines that have never yet been evaluated and that would thus not be available in a cache memory.

DESCRIPTION OF THE DRAWINGS

The invention will be better understood by reading the description of an embodiment given by way of example and illustrated by the attached drawings in which.

DETAILED DESCRIPTION OF THE INVENTION

Although the following description relates more particularly to the case of an instructions ROM in a signal processor, the one skilled in the art will understand that the invention can in fact be applied to any type of memory comprising portions read in a predetermined sequence.

Figure 3:
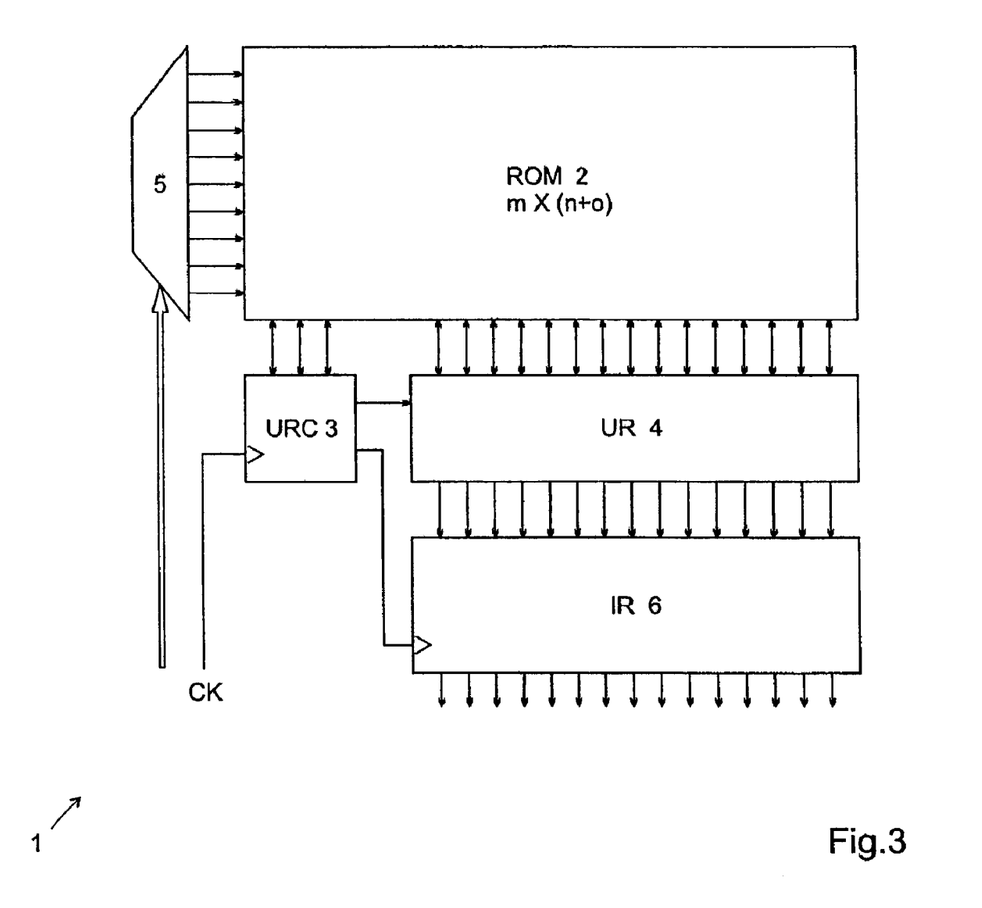
FIG. 3 illustrates diagrammatically the structure of a control module according to a preferred embodiment of the invention.
Figure 4:
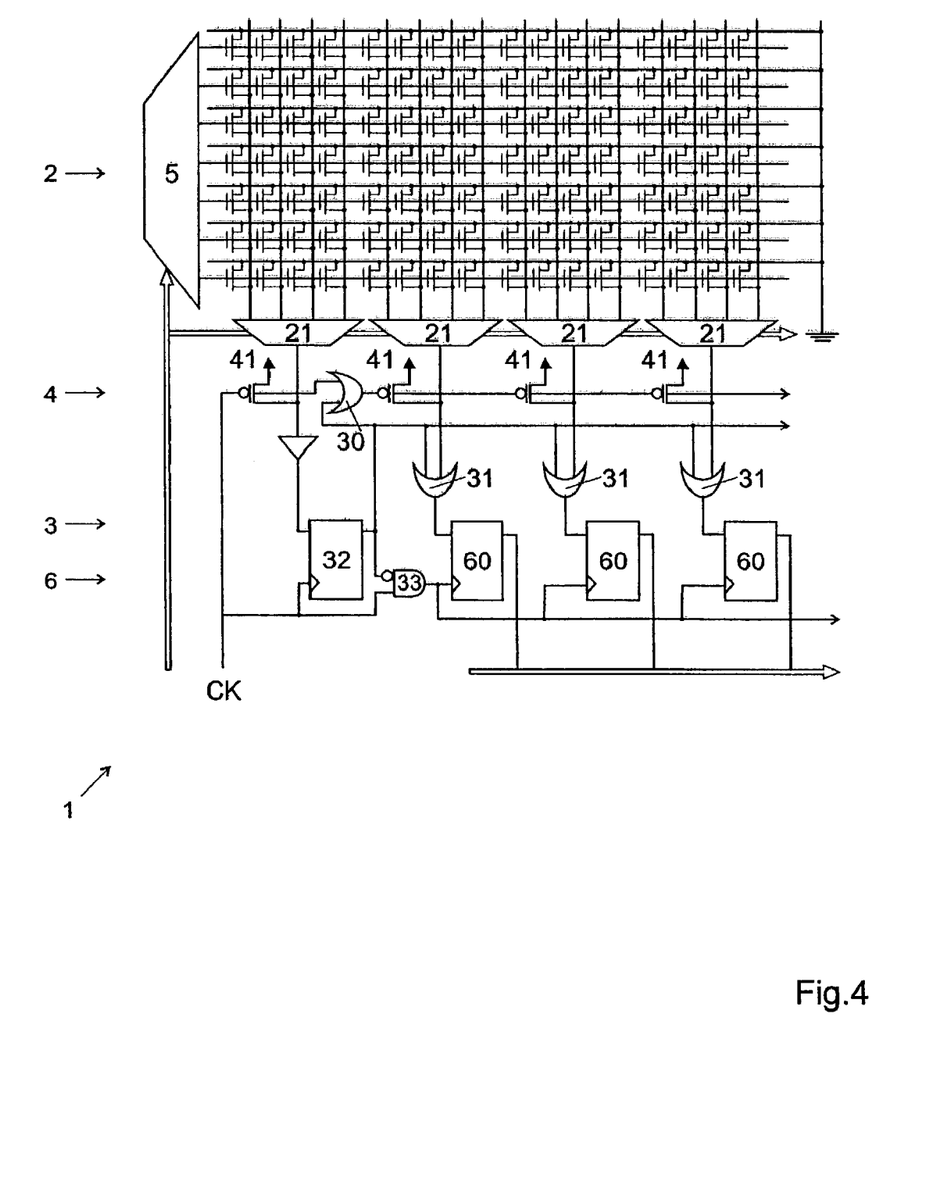
FIG. 4 illustrates in more detail the structure of a control module according to a preferred embodiment of the invention.

FIG. 3 illustrates diagrammatically the structure of a control module according to the invention, this structure being illustrated in more detail in FIG. 4.

The control module 1 comprises a ROM (Read Only Memory) 2 of m lines and (n+o) bits in which the instructions are stored. Each of the ROM's m×(n+o) cells allows a bit to be stored indicating a logic state zero (0) or one (1). The cells can for example be constituted by elements of the type NOR as illustrated in FIG. 2 or by any other type of element used in memories of this type, e.g. ROM, EEPROM, Flash or RAM.

The module further comprises a column preload circuit 4', constituted for example by an additional line of preload transistors as illustrated in FIG. 2, or by other preload means of known type capable of imposing a preload voltage, for example Vdd, on the columns selected during the preload cycles. According to a characteristic of the invention, the preload circuit 4 makes it possible to selectively preload different sections of groups of columns, as will be seen further below.

At each cycle, the line indicated by the address controller (not represented) is selected by the demultiplexer 5 that applies a selection voltage (for example Vdd) on this line in order to cause all transistors on this line to become conducting. The voltage of the preloaded columns corresponding to these transistors is thus "pulled" to the drain's voltage Vss, whilst the other columns remain preloaded. The instruction corresponding to the preloaded columns of the selected line is thus available on the columns and is loaded in an instructions register 6 under the control of a clock signal CK. The data loaded in the instructions register 6 are for example used for determining the operation of different modules in the data path of a signal processor.

According to the invention, part of the bits read at each cycle is loaded in a reader and preload controller 3 URC whereas the n other bits are transferred into the instructions register 6 through a preload and transfer control circuit 4. The o bits loaded and stored in the controller 3 determine which sections of the ROM 2 will have to be preloaded and transferred during subsequent reading cycles, for example during the following cycle. The operation of the preload and transfer control circuit 4 at each cycle thus depends on the state of the controller 3 which is determined, during the previous reading cycles, according to the contents of the ROM 2.

In a preferred embodiment of the invention, each line of the ROM 2 is divided in several predefined sections each comprising one or several columns. The sections selected during each cycle, i.e. those that are preloaded and whose contents are transferred into the register 6, are determined by one or several bits stored in the controller 3 during one or several previous reading cycles. Each section preferably regroups the columns in which are stored the command bits of a given module of the data path, for example an ALU (Arithmetic-Logic Unit) etc. The controller 3 thus allows to determine, according to the indications read in the ROM 2 during previous cycles, which modules will receive a new instruction. The width of the different sections, i.e. the number of columns, can be identical or different according to the width of the command word of each module of the data path.

In another embodiment, the controller 3 allows to select individually and during each cycle the columns that are to be preloaded and transferred. This variant embodiment offers maximum flexibility since it is possible to reuse parts of instructions or of operands commanding each module, at the price however of a great number o of command bits and thus of a substantial increase of the ROM's width and possibly of the consumption.

In another simplified embodiment, each line of the ROM 2 comprises a single bit indicating simply whether the following instruction line must be read or whether it is identical to the contents of the instructions register 6. This solution requires a single additional bit per line. However, each line must be completely re-read even if it differs only slightly from the preceding line. An example of this variant embodiment is described further below in relation with FIGS. 4 and 5.

The read and preload controller 3 is preferably arranged so as to receive at each reading cycle instructions used for determining the sections and the columns that will have to be preloaded and transferred during the cycle immediately following the current cycle. It thus avoids having to re-read several times in a row the same instructions in the ROM 2. It will however be understood that it is also possible within the framework of this invention to realize the controller 3 so that it interprets the instructions read in the ROM to control the reading of any section of this ROM during any subsequent reading cycle or group of cycles. For example, it is possible to devise more or less complex instructions that will be interpreted by the controller 3 for discontinuing the reading of portions of the ROM according to different schemas and according to different conditions, for example according to the address controller's contents or even according to the contents of other portions of the ROM or to the state of registers in the data path. It is notably possible to discontinue the reading of lines or line portions in response to the detection of a predefined event in the data stream processed by the data path; a trigger can be specifically devised for detecting these conditions. Furthermore, it is also possible to discontinue the reading of line sections when the modules commanded by the instructions read in these sections are in standby mode or stopped.

The temporary instructions memory 6 is preferably constituted of a single line of memorization elements, for example of flip-flops, as will be seen further below. It thus enables a complete instruction line to be stored that will be regenerated fully or partially at each cycle. It is however also possible to use a temporary buffer capable of storing several instruction lines that can be reused fully or partially during several subsequent cycles, depending on the state of the controller 3.

When the sequence of instructions programmed in the ROM 2 uses efficiently the possibilities of parallel processing of the data path's module, most of the instructions will be regenerated considerably at each cycle. The number of sections that can be reused is thus generally lower than the number of sections that must be re-read. According to the invention, the bits indicating that a section of the ROM 2 must be transferred into the temporary buffer 6 will thus preferably be encoded with a logic state "one" draining less current during reading than the bits indicating that a new transfer is not necessary. However, there is nothing against encoding the transfer instruction with different logic states according to the sections, as a function of the rate of reuse of the instructions in each section.

An embodiment of the control module according to the invention will now be described in more detail with the aid of FIG. 4. The module comprises a ROM 2 with a demultiplexer 5, a read controller 3 including the elements 30 to 33, a preload circuit 4 illustrated in simplified manner and including the elements 41 as well as an instructions register 6.

The ROM 2 is, in this example, of the type NOR and comprises m lines and n+o output bits. The memory is programmed by placing at each intersection of lines and columns a transistor for encoding a logic "zero", or no transistor for encoding a logic "one". The columns are distributed in groups of adjacent columns, a multiplexer 21 allowing to select, at each moment, among each group, the column that is to be activated. This arrangement makes it possible to reduce the number of lines and to increase the number of columns of the memory, and thus to obtain a shape of the memory that is approximately square, or at least adapted to the space available on the integrated circuit. The number of columns of the memory is in this case greater than the number of output bits n+o supplied at each reading cycle. The memory illustrated in FIG. 4 comprises four groups of four columns each; it will be understood that in practice, a greater number of groups and/or a different number of columns per group can be used.

The ROM 2 is read by preloading, by means of preload transistors 41, a single column in each of the groups. The columns selected by the elements 21, according to the corresponding bits of the address counter (not represented), are thus loaded with a voltage Vdd whilst the other columns remain floating.

During the evaluation cycle, a line indicated by the other bits supplied by the address counter is selected by the demultiplexer 5 by applying a high tension sufficient for causing the transistors whose gate is connected to this line to become conducting. The columns preloaded during a previous preload cycle thus take on a logic state that depends on the presence or absence of transistors in the selected line; this state is then transferred through the multiplexers 21 and the logic elements 31 into the instructions register 6, as will be seen further below.

The address controller scans the memory sequentially line by line, by selecting for each line first the first column of each group, then the second, and so forth until the last of each group. In a preferred embodiment, the memory is read by scanning successively all the lines with the first selected column of each group, then reading the second columns of each group, and so forth. This variant embodiment enables the columns to be unloaded by reading non-significant bits between two preload cycles and thus the necessary preload current to be reduced. It will however be understood that the same memory can be scanned according to these two modes simply by permuting the high order bits with the low order bits of the address controller.

In the example represented, the bit supplied at each cycle by the first multiplexer 21 (on the left in the Figure) is loaded during the rising flank of the clock signal CK in a storage element 32, for example a flip-flop. This bit is in the logic state "zero" when the data accessed during the subsequent cycle must be transferred into the instructions register 6 and in the logic state "one" when no transfer is necessary. A logic gate 30 of the type OR adds the bit stored in the storage element 32 to the clock signal CK. The output of the gate 30 thus takes the logic state "zero" only when the signal CK is at "zero" and a "zero" is stored in the element 32. The preload transistors 41 preload the columns selected by the multiplexers 21 when this condition is fulfilled.

Logic gates 31 of the type OR add the signal supplied by each multiplexer 21 with the output bit of the storage element 32. The output state of the gates 31 thus take the logic state "zero" only when a "zero" is stored in the storage element 32 (indicating that an update is required) and a "zero" is supplied by the corresponding multiplexer 21. The signal at the output of the gates 31 is loaded in the corresponding storage elements 60 during the rising flank of a signal supplied by the logic gate AND 33, i.e. when a "zero" is stored in the storage element 32 and the clock signal CK switches to "one".

The value stored in the storage element 32 thus determines whether the columns selected during the subsequent cycle must be preloaded by the transistors 41 and whether their contents must be stored in the storage elements 60.

It will be understood that minimal adaptations can be made to this circuit to define more accurately, by means of several bits or several phases at each cycle, which portions of the memory have to be preloaded and transferred into the instructions register 6. The memory portions selected can for example correspond to one or several predefined groups or to any section of the ROM 2.

Figure 5:
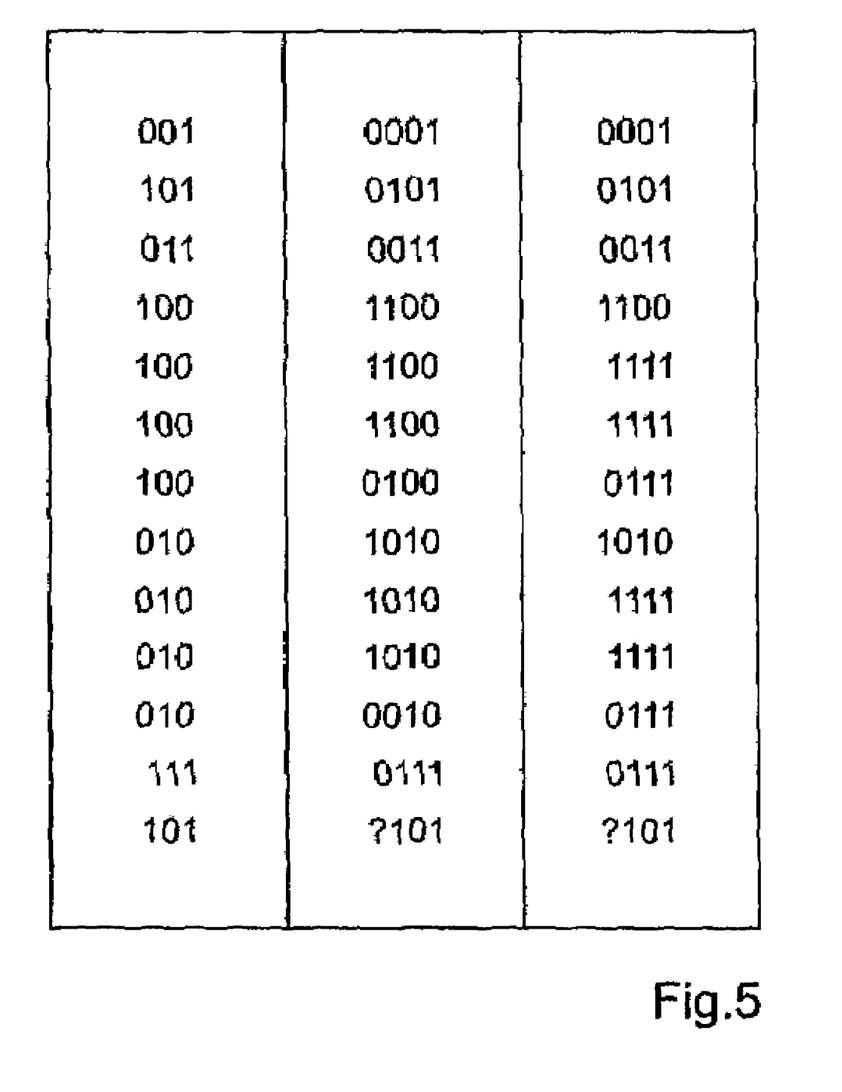
FIG. 5 is a table showing the code conversion necessary for programming the instructions memory according to the invention.

FIG. 5 illustrates diagrammatically and by way of example the transcoding that must be performed on the sequence of command instructions indicated in the left part of the table for programming the ROM according to the invention. The transcoding consists simply in adding to each instruction a bit for programming the flip-flop 32, which takes the logic value "one" when the following instruction is identical and must thus not be re-read in the ROM 2 (second column of the Figure). As already mentioned, it would also be possible, by adapting slightly the circuit of FIG. 4, to encode the instructions for updating the register 6 by "ones" in order to reduce the electric consumption in a typical application of the circuit.

The portions of the ROM that will not be read due to the encoding of the preceding instruction can be programmed at any value. An additional reduction of the electric consumption can be achieved by programming them with a logic "one" so as to reduce the number of transistors in the memory. The corresponding encoding is indicated in the third column of FIG. 5.

The present invention thus concerns a control module 1 comprising the characteristics claimed and an embodiment of which has been described here above. The present invention however also concerns a ROM 2 programmed in the manner described so that it can be used in such a control module, as well as any computer data carrier, for example of magnetic, optical or magneto-optical type, in which a sequence of instructions is stored that can be loaded in such a memory for commanding a control module of the claimed type and achieving the expected advantages. The present invention also concerns complete integrated circuits, for example sold in the form of individual components, notably signal processors, and hearing aid devices equipped with such circuits. Furthermore, the invention can also be commercialized in the form of libraries of electronic modules, for example in the form of an electronic file describing the control module in a function form (netlist) or structural form (topography), for example in the form of a computer data carrier containing such an electronic file describing the function and/or the topography of the electronic circuit, capable of being opened or imported in an integrated circuit compiler for generating manufacturing masks for the claimed control module.

Although the following description relates more particularly to the particular case of a dynamic ROM of the NOR type, the one skilled in the art will understand that the invention can also be applied to other types of dynamic memories or even to ROMs of static type. Furthermore, the invention can also be applied to memories in which reading is performed with the aid of sense amplifiers. Just as the preloading of the columns that are not read can be discontinued, it is also possible to interrupt the feeding of the sense amplifiers when it is not necessary to read the corresponding columns.

The one skilled in the art will furthermore understand that the invention can also be applied with components other than ROMS, for example with components of the type EEPROM, FPGA, Flash or RAM.

The invention claimed is:

1. A control module, comprising the following elements:
a read-only memory (ROM),
a temporary buffer, into which the data of said ROM can be transferred in order to be accessible from outside the control module,
a read controller, for selecting at each cycle portions of said ROM transferred into said temporary buffer, the selected portions depending on the contents of said ROM,
wherein said ROM comprises one or more bits indicating a portion of said ROM, said one or more bits allowing said read controller to be controlled so that said portion is not selected to be transferred into said temporary buffer.

2. The control module of claim 1, comprising a column preload circuit of said ROM, the columns preloaded at each reading cycle being dependent on the contents of said ROM.

3. The control module of claim 2, wherein only the columns corresponding to said portions selected by said read controller are preloaded.

4. The control module of claim 1, comprising a circuit for reading the columns of said ROM, said reading circuit including sense amplifiers, the sense amplifiers activated at each reading cycle for reading the columns being dependent on the contents of said ROM.

5. The control module of claim 4, wherein each line of said ROM is divided in several sections,
said read controller selecting according to the contents of said ROM the sections of the selected line transferred into said temporary buffer at each reading cycle.

6. The control module of claim 5, wherein at least certain lines of said ROM contain at least one bit indicating the sections transferred into said temporary buffer during at least one subsequent reading cycle.

7. The control module of claim 6, wherein each line of said ROM contains at least one bit indicating the sections transferred into said temporary buffer during the next reading cycle.

8. The control module of claim 7, wherein said ROM drains more current for reading one bit having a first logic level than for reading one bit having a second logic level,
and wherein the bits indicating that a section is to be transferred are encoded with said second logic level.

9. The control module of claim 1, wherein said temporary buffer is constituted by an instructions register.

10. The control module of claim 5, wherein said ROM drains more current for reading one bit having a first logic level than for reading one bit having a second logic level, and wherein the concentration of bits having said first logic level is lower in the sections that are not to be transferred into said temporary buffer.

11. The control module of claim 1, wherein said ROM drains more current for reading one bit having a first logic level than for reading one bit having a second logic level,
and wherein said non-selected portion of said ROM is encoded with bits having the second logic level.

12. The control module of claim 1, wherein the columns of said ROM are divided in several groups, a plurality of multiplexers allowing to select at each reading cycle a column in each group of columns, only the selected columns being preloaded and read during said cycle.

13. The control module of claim 12, wherein said read controller determines at each cycle which of the signals at the output of said multiplexers are transferred into an element of said temporary buffer.

14. A signal processor comprising at least one control module according to claim 1.

15. An hearing-aid device comprising at least one signal processor according to claim 14.

* * * * *